(12) United States Patent
Oh et al.

(10) Patent No.: US 12,451,382 B2
(45) Date of Patent: Oct. 21, 2025

(54) TRAY AND DESTRUCTIVE ANALYSIS AUTOMATION APPARATUS INCLUDING THE SAME

(71) Applicant: SAMSUNG ELECTRONICS CO., LTD., Suwon-si (KR)

(72) Inventors: Youn Gon Oh, Hwaseong-si (KR); Ji Hun Kim, Uiwang-si (KR); Sae Yun Ko, Hwaseong-si (KR); Gil Ho Gu, Hwaseong-si (KR); Dong Su Kim, Incheon (KR); Eun Hee Lee, Hwaseong-si (KR); Ho Chan Lee, Seoul (KR); Seong Sil Jeong, Incheon (KR); Seong Pyo Hong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 832 days.

(21) Appl. No.: 17/718,754

(22) Filed: Apr. 12, 2022

(65) Prior Publication Data

US 2023/0101674 A1    Mar. 30, 2023

(30) Foreign Application Priority Data

Sep. 29, 2021   (KR) .......................... 10-2021-0128675

(51) Int. Cl.
*H01L 21/673* (2006.01)
*H01L 21/66* (2006.01)

(52) U.S. Cl.
CPC ........ *H01L 21/67333* (2013.01); *H01L 22/12* (2013.01)

(58) Field of Classification Search
None
See application file for complete search history.

(56) References Cited

U.S. PATENT DOCUMENTS

| 5,125,784 | A | * | 6/1992 | Asano ............... H01L 21/67781 414/404 |
| 5,660,517 | A | * | 8/1997 | Thompson ........ H01L 21/67742 414/217 |
| 5,863,808 | A | * | 1/1999 | Tsunoda ............ H01L 21/67366 438/18 |
| 7,999,240 | B2 | | 8/2011 | Tomimatsu et al. |
| 9,496,187 | B2 | | 11/2016 | Ng et al. |
| 10,707,137 | B2 | | 7/2020 | Balashov et al. |
| 2008/0149827 | A1 | * | 6/2008 | Lee ..................... H01L 21/6838 250/288 |
| 2014/0077002 | A1 | * | 3/2014 | Krayer ................. B05B 1/3046 239/458 |

FOREIGN PATENT DOCUMENTS

| JP | 2006-156263 A | 6/2006 |
| JP | 2018-63249 A | 4/2018 |

(Continued)

*Primary Examiner* — Kidest Bahta
(74) *Attorney, Agent, or Firm* — Sughrue Mion, PLLC

(57) ABSTRACT

Provided is a tray including a plate including a first region and a second region, a first groove on the first region of the plate and to which a stub is fixed, and a second groove on the second region of the plate and to which a grid holder is fixed, wherein the stub is configured to store test wafer pieces, and wherein the grid holder is configured to store a test sample.

20 Claims, 21 Drawing Sheets

(56) References Cited

FOREIGN PATENT DOCUMENTS

| | | |
|---|---|---|
| KR | 10-2000-0020067 A | 4/2000 |
| KR | 10-2009-0068528 A | 6/2009 |
| KR | 10-2014-0043177 A | 4/2014 |
| KR | 10-2016-0085995 A | 7/2016 |
| KR | 10-2017-0143443 A | 12/2017 |
| KR | 10-2018-0094441 A | 8/2018 |
| KR | 10-2020-0012533 A | 2/2020 |

* cited by examiner

TRAY AND DESTRUCTIVE ANALYSIS AUTOMATION APPARATUS INCLUDING THE SAME

CROSS-REFERENCE TO RELATED APPLICATION

This application claims priority to Korean Patent Application No. 10-2021-0128675 filed on Sep. 29, 2021 in the Korean Intellectual Property Office, the disclosures of which in its entirety are herein incorporated by reference.

BACKGROUND

1. Field

Embodiments of the present disclosure relate to a single integrated tray designed to simultaneously mount a sample aid for wafer destructive analysis and a cartridge to be transported/stored/operated, and a destructive analysis automation apparatus including the same.

2. Description of Related Art

As semiconductor processes are gradually miniaturized, an aspect ratio of a semiconductor device is increasing. As the aspect ratio increases, semiconductor processes are becoming more difficult. Therefore, a destructive analysis of the wafer for a mechanism analysis of the semiconductor processes also tends to increase.

However, related destructive analysis processes of the wafer have been performed manually from wafer input to sample fabrication and photographing/analysis. When the processes are performed manually, reliability problems on setting of a destructive analysis region, problems on damage to the region of interest due to manual work, and safety problems may occur.

To automate a transportation process of the sample between analysis apparatuses and a storage process of the sample, it is necessary to develop a transport/storage device for each sample aid. In this case, the transport/storage devices for each sample aid cannot be mixed with each other.

SUMMARY

One or more embodiments provide a single integrated tray for transporting/storing the sample aid required for destructive analysis of wafer.

One or more embodiments also provide a destructive analysis automation apparatus having improved efficiency and productivity.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to an aspect of an example embodiment, there is provided a tray including a plate including a first region and a second region, a first groove on the first region of the plate and to which a stub is fixed, and a second groove on the second region of the plate and to which a grid holder is fixed, wherein the stub is configured to store test wafer pieces, and wherein the grid holder is configured to store a test sample.

According to another aspect of an example embodiment, there is provided a tray including a plate including a first side surface, a second side surface opposite to the first side surface, a third side surface that connects the first side surface and the second side surface, a fourth side surface opposite to the third side surface, and an upper surface that connects the first side surface, the second side surface, the third side surface, and the fourth side surface, a plurality of grooves on the upper surface of the plate, and respectively configured to fix a stub and a grid holder, and a tray ID on the third side surface, wherein the stub is configured to store test wafer pieces, wherein the grid holder is configured to store a test sample, and wherein the plate includes an overhead hoist transport (OHT) handling region extending from the first side surface and the second side surface in a first direction, and a tray stocker handling region extending from the third side surface to the fourth side surface in a second direction.

According to another aspect of an example embodiment, there is provided a destructive analysis automation apparatus including a tray stocker configured to store a tray and generate a tray ID including information about the tray, a main device configured to form test wafer pieces and form a test sample, a first equipment front end module (EFEM) installed on a side of the main device, and a second EFEM installed on a side of the tray stocker, wherein the tray includes a plate including a first region and a second region, a first groove on the first region of the plate and to which a stub is fixed, and a second groove on the second region of the plate and to which a grid holder is fixed, wherein the tray ID is on a side surface of the plate, wherein the stub is configured to store the test wafer pieces, and wherein the grid holder is configured to store the test sample.

BRIEF DESCRIPTION OF THE DRAWINGS

The above and/or other aspects and features of the present disclosure will become more apparent by describing in detail example embodiments thereof with reference to the attached drawings, in which.

DETAILED DESCRIPTION

Hereinafter, embodiments will be explained in detail with reference to the accompanying drawings. Embodiments described herein are example embodiments, and the present disclosure is not limited thereto.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Hereinafter, a tray according to embodiments, a destructive analysis automation apparatus including the same, and an operating method of the destructive analysis automation apparatus will be described referring to FIGS. 1 to 21.

Figure 1:
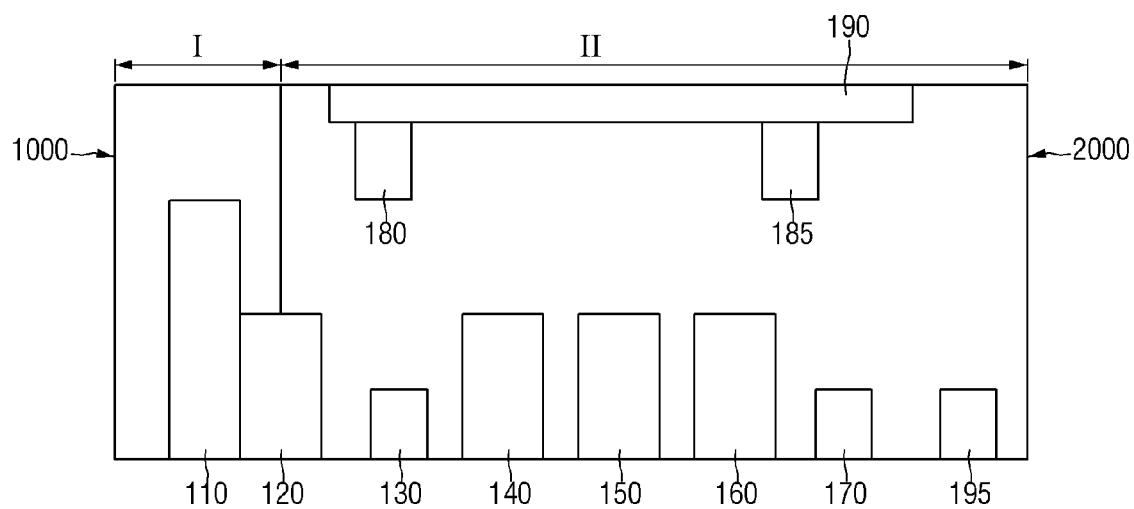
FIG. 1 is a conceptual diagram illustrating the destructive analysis automation apparatus according to embodiments.

FIG. 1 is a conceptual diagram illustrating the destructive analysis automation apparatus according to embodiments. Hereinafter, the destructive analysis automation apparatus will be described using FIG. 1.

Referring to FIG. 1, the destructive analysis automation apparatus according to embodiments includes a first region I and a second region II.

The first region I may be a region in which the semiconductor process is performed, and the second region II may be a region in which the semiconductor destructive analysis is performed. The first region I may be, for example, a process chamber 1000, and the second region II may be, for example, an analysis chamber 2000. The first region I may be a clean region. The second region II may be a non-clean region. Although the first region I and the second region II are shown as being adjacent to each other, embodiments are not limited thereto. The first region I and the second region II may be adjacent to each other or may be spaced apart from each other.

The destructive analysis automation apparatus according to embodiments may include an interlayer transport module 110, an exchange module 120, a wafer stocker 130, a pre-processing module 140, a sample fabrication module 150, an analysis module 160, a tray stocker 170, a front opening unified pod (FOUP) transfer module 180, a tray transfer module 185, a transfer rail 190, and a central module 195. The central module 195 may include an application specific integrated circuit (ASIC), a field-programmable gate array (FPGA), a dedicated microprocessor, a microprocessor, a general purpose processor, or the like.

The interlayer transport module 110 may be installed in the first region I. The interlayer transport module 110 may be installed inside the process chamber 1000. The interlayer transport module 110 may transfer or convey a first Front Opening Unified Pod in a vertical direction. The first FOUP may be a space for storing a plurality of first wafers.

The interlayer transport module 110 may include a plurality of stages spaced in the vertical direction. The interlayer transport module 110 may convey the first FOUP to each stage. For example, when the interlayer transport module 110 includes a first stage and a second stage that are spaced apart from each other in the vertical direction, the interlayer transport module 110 may convey the first FOUP from the first stage to the second stage. Further, the interlayer transport module 110 may convey the first FOUP from the second stage to the first stage.

The exchange module 120 may be connected to the interlayer transport module 110. For example, the exchange module 120 may be directly connected to the interlayer transport module 110. The exchange module 120 may be provided at a boundary between the first region I and the second region II. The exchange module 120 may be provided at a boundary between the process chamber 1000 and the analysis chamber 2000. However, embodiments are not limited thereto.

The exchange module 120 may convey the first wafer inside the first region I to the second region II. The exchange module 120 may convey the first wafer inside the process chamber 1000 to the analysis chamber 2000. For example, the exchange module 120 may receive the first wafer from the interlayer transport module 110. The exchange module 120 may store the first wafer, which is received from the interlayer transport module 110, in the second FOUP. The first FOUP may be a process chamber FOUP, and the second FOUP may be an analysis chamber FOUP.

For example, the first FOUP conveyed from the interlayer transport module 110 may be loaded into the exchange module 120. The first wafer in the first FOUP may be unloaded from the first FOUP and loaded into the second FOUP. Information about the first wafer may be stored in a wafer ID. The wafer ID may be reported to a host system, for example, a central module 195 by a computer. The wafer ID may be tracked and controlled by the central module 195.

The wafer stocker 130 may be installed inside the second region II. The wafer stocker 130 may be installed inside the analysis chamber 2000. For example, the wafer stocker 130 may be installed on a bottom surface of the analysis chamber 2000. The wafer stocker 130 may informationize the first wafer. The wafer stocker 130 may informationize the first wafer to form a second wafer. For example, the informationized first wafer may be the second wafer.

As an example, the wafer stocker 100 may store the second wafer. As another example, the wafer stocker 100 may discard a wafer (a disposal wafer) that remains after forming test wafer pieces (e.g., W of FIG. 4). As still another example, the wafer stocker 100 may store the disposal wafer, and the stored disposal wafer may be reused later. The disposal wafer is stored for a preset period of time, and when the period of time elapses, the disposal wafer may be automatically transferred to a disposal box and discarded. Such a process may be reported to the central module 195 by a computer.

The pre-processing module 140 may be installed in the second region II. The pre-processing module 140 may be installed inside the analysis chamber 2000. For example, the pre-processing module 140 may be installed on the bottom surface of the analysis chamber 2000. The pre-processing module 140 may perform the pre-processing work. The pre-processing work may include formation of the test wafer piece W and formation of the disposal wafer.

For example, the pre-processing module 140 may form the test wafer pieces W and the disposal wafer, using the second wafer. Further, the pre-processing module 140 may generate a second ID including information about the test wafer pieces W. The ID may be stored in a tray ID (230 of FIG. 3) and reported to the central module 195 by a computer. The test wafer pieces W may be stored in a stub (S of FIG. 3). A plurality of test wafer pieces W may be informationized with different IDs from each other, for example, stub IDs. The central module 195 may track and control the stub ID.

A first equipment front end module (EFEM) 300 may be installed on one side of the pre-processing module 140. The first EFEM 300 may be a space in which the second wafer to be loaded into the pre-processing module 140 or the tray 200 to be unloaded from the pre-processing module 140 stays for a certain time.

The sample fabrication module 150 may be installed inside the second region II. The sample fabrication module 150 may be installed inside the analysis chamber 2000. For example, the sample fabrication module 150 may be installed on the bottom surface of the analysis chamber 2000. The sample fabrication module 150 may fabricate a sample for testing the wafer. The test wafer pieces W may be loaded into the sample fabrication module 150. After that, the sample fabrication may be performed. When the sample fabrication is performed, the test sample may be fabricated. The test sample may be fabricated by cutting a part of the test wafer pieces W.

The test sample for which the work has been completed is fixed to a grid holder (GH of FIG. 4) and stored therein. The position of the test sample fixed to the grid holder GH may be stored in the grid ID. The grid ID is reported to the central module 195 by a computer. The grid holder GH is fixed to the tray 200, and information about the test sample is stored in the tray ID 230 assigned in advance.

The first EFEM 300 may be installed on one side of the sample fabrication module 150. The first EFEM 300 may be a space in which the tray 200 to be loaded into the sample fabrication module 150 or the tray 200 to be unloaded from the sample fabrication module 150 stays for a certain time.

The analysis module 160 may be installed inside the second region II. The analysis module 160 may be installed inside the analysis chamber 2000. For example, the analysis module 160 may be installed on the bottom surface of the analysis chamber 2000. The analysis module 160 may perform photographing/analysis works on the test sample. The first EFEM 300 may also be installed on one side of the analysis module 160. However, embodiments are not limited thereto.

The tray stocker 170 may be installed inside the second region II. The tray stocker 170 may be installed inside the analysis chamber 2000. For example, the tray stocker 170 may be installed on the bottom surface of the analysis chamber 2000. The tray stocker 170 may informationize the tray 200. Further, the tray stocker 170 may store the tray 200. The tray 200 may store the test wafer pieces W and the test sample. For example, the test wafer pieces W and the test sample may be placed in the tray 200 and conveyed, and may be stored in the tray 200. The tray stocker 170 may automatically store the tray 200 loaded into the tray stocker 170.

The tray stocker 170 may generate the tray ID 230 including information about the tray 200. The tray ID 230 may store a stub ID including information about the test wafer pieces W and a grid ID including information about the test sample. The IDs are reported to the central module 195 by a computer. The tray ID 230 may be loaded with all kinds of information about the test wafer pieces W. The tray ID 230 may be controlled at the center. The tray ID may be used to track the history of future analysis processes.

A second (EFEM 400 of FIG. 10) may be installed on one side of the tray stocker 170. The second EFEM 400 may be a space in which the tray 200 to be loaded into the tray stocker 170 or the tray 200 to be unloaded from the tray stocker 170 stays for a certain time.

The transfer rail 190 may be installed inside the second region II. The transfer rail 190 may be installed inside the analysis chamber 2000. The transfer rail 190 may be installed on the ceiling of the analysis chamber 2000. The transfer rail 190 may convey the wafer and the test wafer pieces W.

The first wafer may be conveyed from the exchange module 120 to the wafer stocker 130 along the transfer rail 190. The second wafer may be conveyed from the wafer stocker 130 to the pre-processing module 140 along the transfer rail 190. The test wafer pieces W may be conveyed from the pre-processing module 140 to the sample fabrication module 150 along the transfer rail 190. The test sample may be conveyed from the sample fabrication module 150 to the analysis module 160 and the tray stocker 170 along the transfer rail 190. The disposal wafer may be conveyed from the pre-processing module 140 to the wafer stocker 130 along the transfer rail 190.

The FOUP transfer module 180 may be a module that conveys a first wafer, a second wafer, and a disposal wafer. The FOUP transfer module 180 may be a module that conveys a second FOUP. For example, the first wafer, the second wafer, and the disposal wafer may be placed in the second FOUP and conveyed.

The FOUP transfer module 180 may move along the transfer rail 190. The FOUP transfer module 180 may convey the second FOUP to the exchange module 120, the wafer stocker 130, and the pre-processing module 140.

The tray transfer module 185 may be a module that conveys a tray 200 including the test wafer pieces W and the test sample. The test wafer pieces W may be stored in the stub S and conveyed. The test sample may be stored in the grid holder GH and conveyed. The tray transfer module 185 may move along the transfer rail 190. The tray transfer module 185 may move along the transfer rail 190. The tray transfer module 185 may convey the tray 200 to the pre-processing module 140, the sample fabrication module 150, the analysis module 160, and the trace stocker 170.

The central module 195 may be installed inside the analysis chamber 2000. However, embodiment are not limited thereto, and for example, the central module 195 may be installed outside of the analysis chamber 2000. The central module 195 may store and track the history of wafer pieces analyzed by the destructive analysis apparatus according to embodiments. For example, the central module 195 may track and control a wafer ID including information about the wafer, a tray ID 230 including information about the tray, a stub ID including information about the test wafer pieces W, and a grid ID including information about the test sample.

When using the destructive analysis automation apparatus according to embodiments, carrying out the wafer from the process chamber to the analysis chamber, and analyzing the wafer inside the analysis chamber may be simplified and automated. Further, the history of the wafer analysis work may be stored, tracked and controlled. The productivity and efficiency of the operation of the destructive analysis automation apparatus may increase accordingly.

Figure 2:
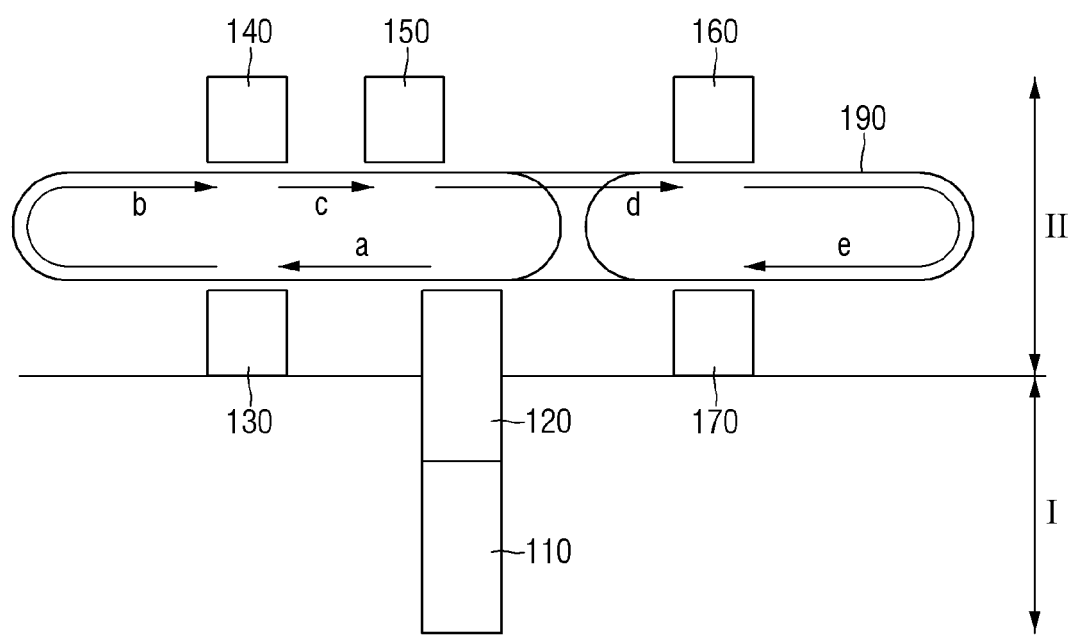
FIG. 2 is a layout diagram illustrating an operating method of the destructive analysis automation apparatus according to embodiments.

FIG. 2 is a layout diagram illustrating an operating method of the destructive analysis automation apparatus according to embodiments. Hereinafter, the operating method of the destructive analysis automation apparatus according to embodiments will be described referring to FIGS. 1 and 2.

Referring to FIGS. 1 and 2, the first wafer may be loaded into the interlayer transport module 110 in the first region I. The first wafer may be loaded into the interlayer transport module 110 in the analysis chamber 2000.

The interlayer transport module 110 may store the first wafer in the first FOUP. The interlayer transport module 110 may convey the first FOUP in the vertical direction.

Subsequently, the interlayer transport module 110 may transfer the first FOUP to the exchange module 120. The exchange module 120 may convey the first wafer in the first FOUP to the second region II. The exchange module 120 may convey the first wafer in the first FOUP to the analysis chamber 2000. For example, the exchange module 120 may unload the first wafer inside the first FOUP and store the first wafer in the second FOUP.

Next, the second FOUP that stores the first wafer may be moved from the exchange module 120 to the wafer stocker 130 (see reference numeral a). The second FOUP is placed in the FOUP transfer module 180 and may move along the transfer rail 190. The second FOUP may be loaded into the wafer stocker 130.

Next, the wafer stocker 130 may unload the first wafer from the second FOUP. The wafer stocker 130 may informationize the first wafer. The wafer stocker may form a second wafer. The second wafer may be obtained by informationizing the first wafer. The wafer stocker 130 may store the second wafer. The second wafer may be placed in the second FOUP again and unloaded from the wafer stocker 130.

The second FOUP may then be loaded into the pre-processing module 140 along the transfer rail 190 (see reference numeral b). The second FOUP may be placed in the FOUP transfer module 180 and conveyed along the transfer rail 190. The pre-processing module 140 may form the test wafer pieces W and the disposal wafer. The test wafer pieces W may be stored in the tray 200. The test wafer pieces W may be stored in the stub S. The disposal wafer may be stored in the second FOUP.

Subsequently, the tray 200 including the stub S in which the test wafer pieces W are placed may be unloaded from the pre-processing module 140. The tray 200 may be moved to the sample fabrication module 150 along the transfer rail 190 (see reference numeral c). The tray 200 may be placed in the tray transfer module 185 and conveyed. The tray 200 may be loaded into the sample fabrication module 150. The sample fabrication module 150 may fabricate a sample for photographing/analyzing the test wafer pieces W. The sample fabrication module 150 may form a test sample. The test sample may be formed by cutting a part of the test wafer pieces W.

Next, the test sample may be unloaded from the sample fabrication module 150 and loaded into the analysis module 160 (see reference numeral d). The test sample may be fixed to the grid holder GH and stored in the tray 200. The test sample may be placed in the tray 200 and be moved along the transfer rail 190. The tray 200 may be placed in the tray transfer module 185 and conveyed. The test sample may be photographed/analyzed inside the analysis module 160.

The test sample subjected to photographing/analysis may be unloaded from the analysis module 160. The test sample subjected to photographing/analysis may be conveyed to the tray stocker 170 along the transfer rail 190 (see reference numeral e). The test sample subjected to photographing/analysis may be placed in the tray 200 and conveyed. The tray stocker 170 may informationize and store the tray 200 in which the test sample subjected to photographing/analysis is placed.

If the analysis module 160 is in a full loading state, the test sample may not be immediately loaded from the sample fabrication module 150 to the analysis module 160. In this case, the test sample unloaded from the sample fabrication module 150 may be moved to the tray stocker 170. The tray 200 in which the test sample is placed may be stored in the tray stocker 170 and wait.

When both the sample fabrication module 150 and the analysis module 160 are in the full loading state, the test wafer pieces may not be loaded from the pre-processing module 140 to the sample fabrication module 150. In this case, the test wafer pieces W unloaded from the pre-processing module 140 may be moved to the tray stocker 170. The tray in which the test wafer pieces W are placed may be stored in the tray stocker 170 for a certain time.

The disposal wafer generated by the pre-processing module 140 may be moved to the wafer stocker 130 again. The disposal wafer is placed in the second FOUP and may be moved to the wafer stocker 130 along the transfer rail 190. The disposal wafer is unloaded to the wafer stocker 130, and the wafer stocker 130 may discard the disposal wafer.

Figure 3:
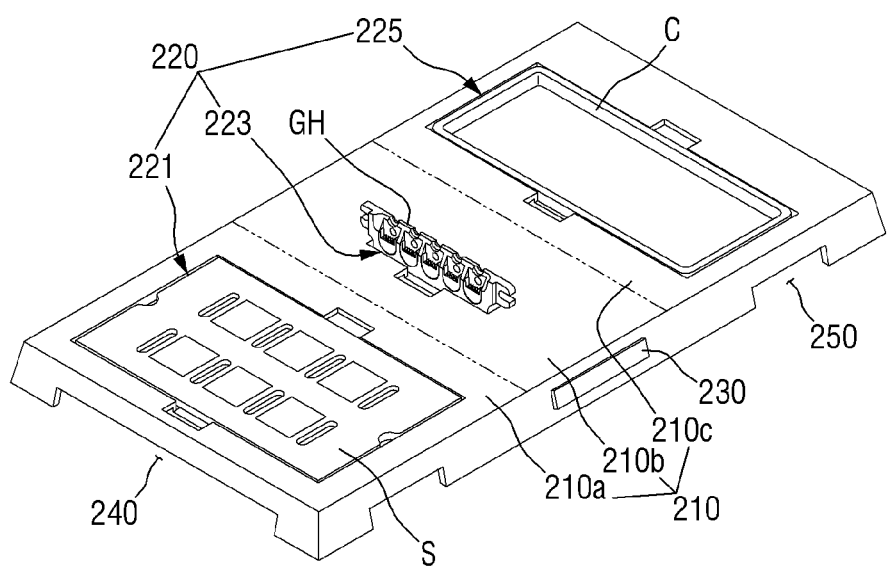
FIG. 3 is an exemplary perspective view of a tray according to embodiments.
Figure 4:
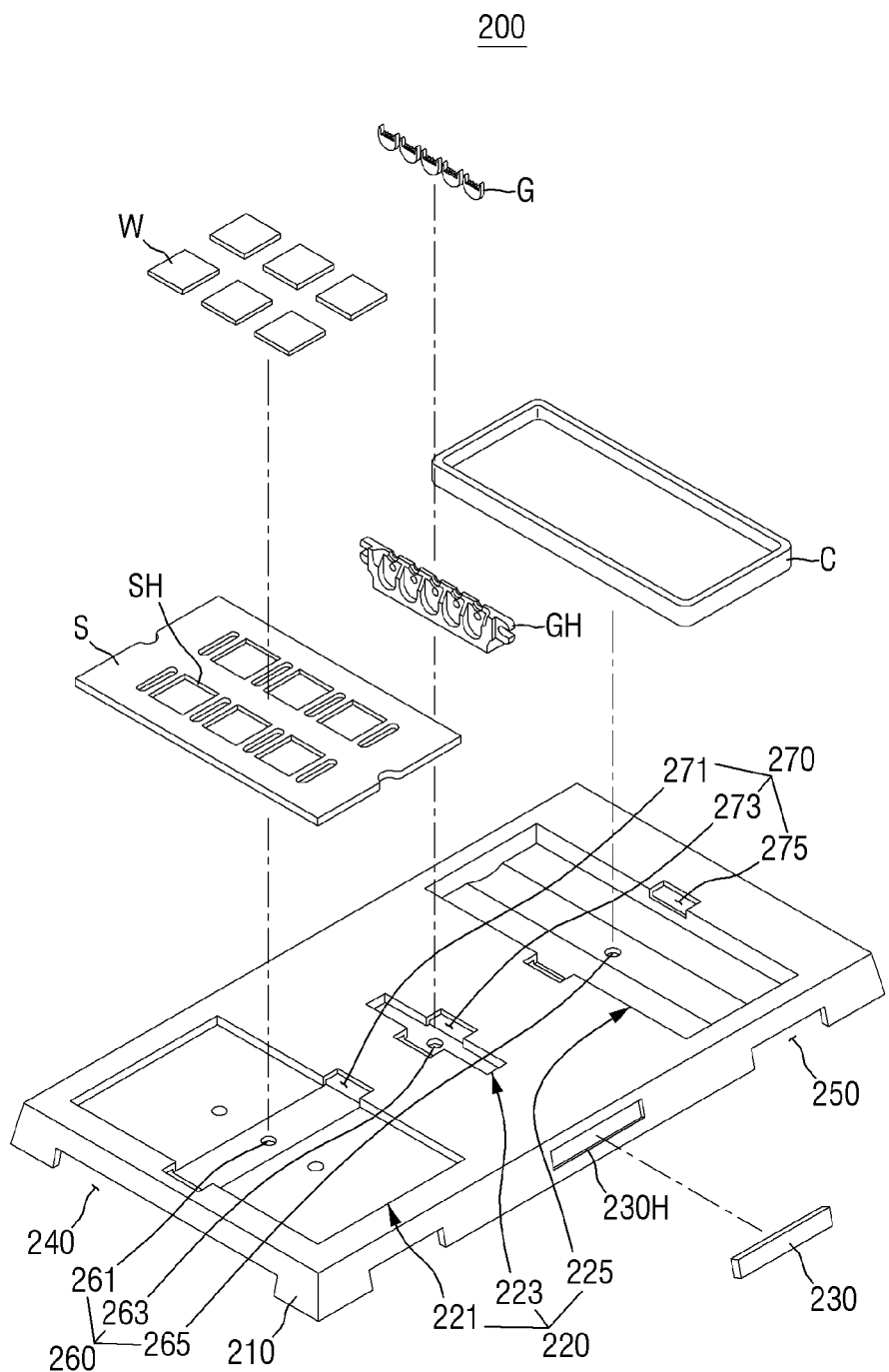
FIG. 4 is a combined perspective view of the tray according to embodiments.
Figure 5:
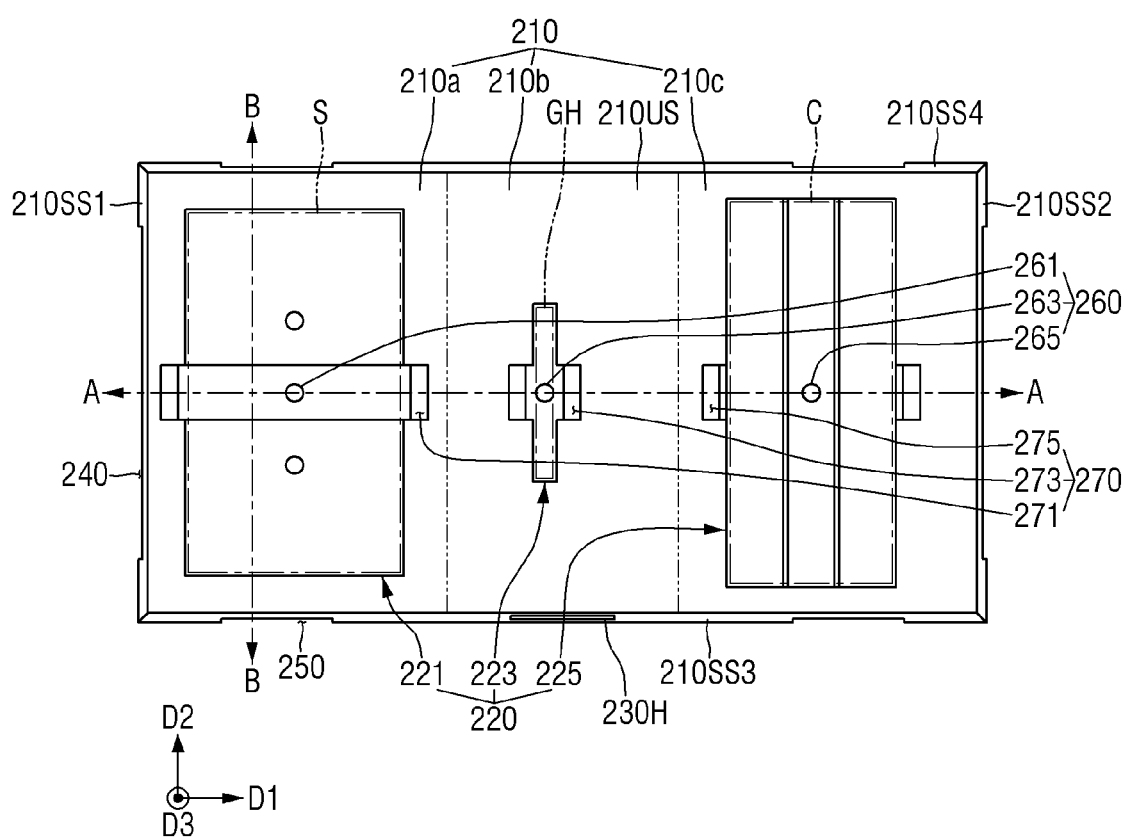
FIG. 5 is a plan view of the tray according to embodiments.
Figure 6:
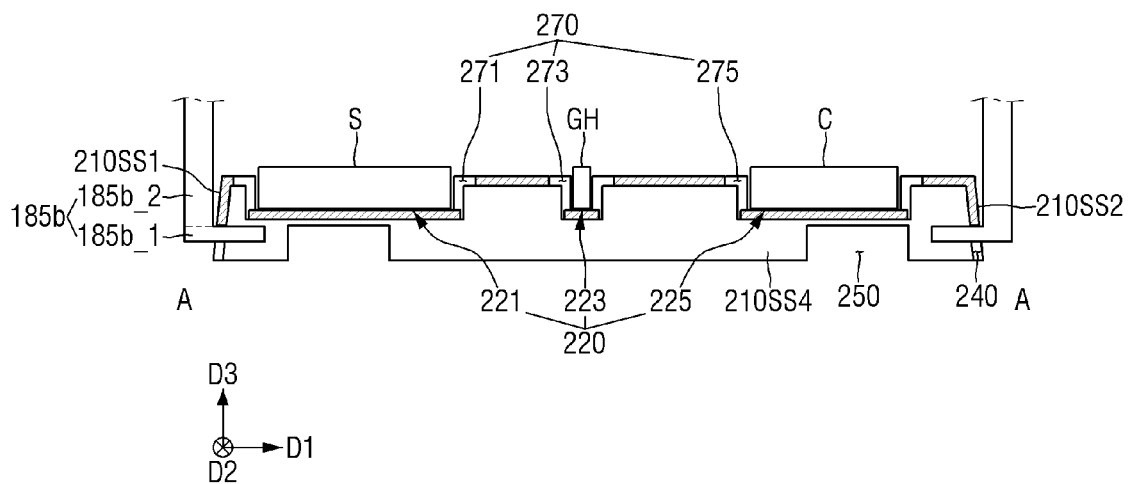
FIG. 6 is a cross-sectional view taken along the line A-A of FIG. 5.
Figure 7:
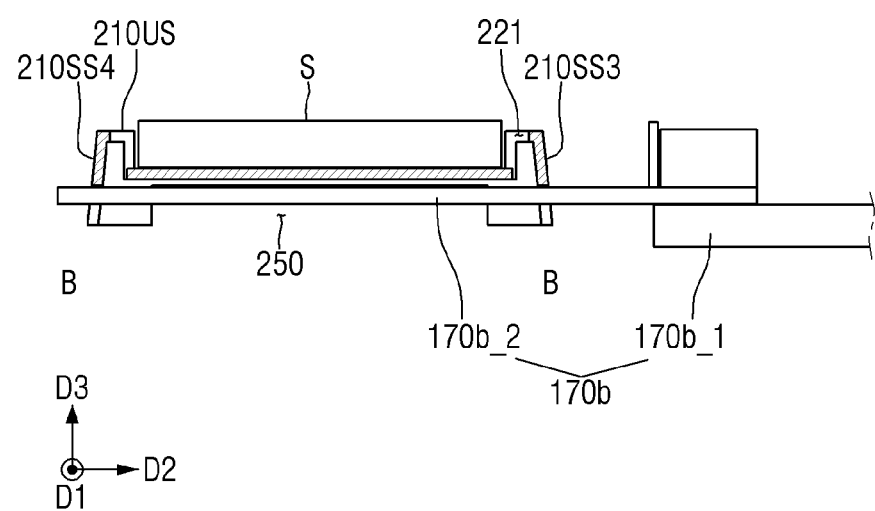
FIG. 7 is a cross-sectional view taken along the line B-B of FIG. 5.
Figure 8:
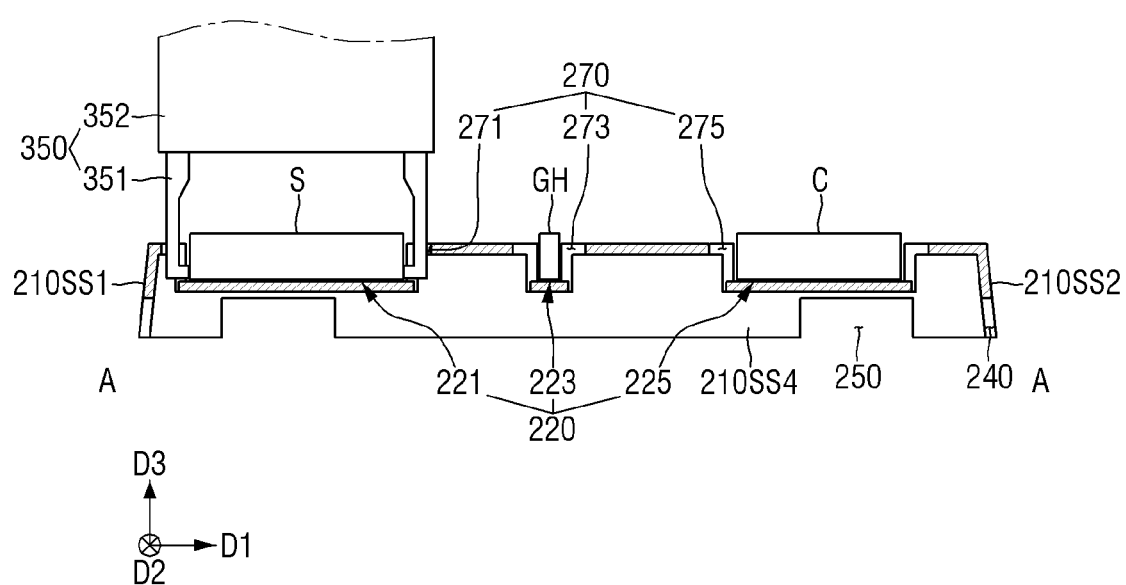
FIG. 8 is a cross-sectional view taken along the line A-A of FIG. 5.

FIG. 3 is an example perspective view of a tray according to embodiments. FIG. 4 is a combined perspective view of the tray according to embodiments. FIG. 5 is a plan view of the tray according to embodiments. FIG. 6 is a cross-sectional view taken along the line A-A of FIG. 5. FIG. 7 is a cross-sectional view taken along the line B-B of FIG. 5. FIG. 8 is a cross-sectional view taken along the line A-A of FIG. 5. Hereinafter, the tray according to embodiments will be described in more detail referring to FIGS. 3 to 8.

Referring to FIGS. 3 to 8, the tray 200 may include a plate 210, a plurality of grooves 220, and a tray ID 230.

The plate 210 may include a first region 210a, a second region 210b, and a third region 210c. The stub S may be placed on the first region 210a of the plate. The grid holder GH may be placed on the second region 210b of the plate. A cartridge C may be placed on the third region 210c of the plate. Although it is shown that one stub S, one grid holder GH, and one cartridge C are each placed on one plate 210, embodiments are not limited thereto. Further, although it is shown that the first region 210a of the plate and the third region 210c of the plate are placed on an edge of the plate 210, and the second region 210b of the plate is placed between the first region 210a of the plate and the third region 210b of the plate, embodiments are not limited thereto.

The tray 200 includes a plurality of grooves 220. The plurality of grooves 220 may be placed on an upper surface 210US of the plate 210. The plurality of grooves 220 may include, for example, a first groove 221, a second groove 223, and a third groove 225. The first groove 221 may be formed in the first region 210a of the plate. The second groove 223 may be formed in the second region 210b of the plate. The third groove 225 may be formed in the third region 210c of the plate.

The first groove 221 may be a groove in which the stub S is seated. The stub S may be fitted to the first groove 221. The stub S is fixed to the tray 200 by the first groove 221. The second groove 223 may be a groove on which the grid holder GH is seated. The grid holder GH may be fitted to the second groove 223. The grid holder GH may be fixed to the tray 200 by the second groove 223. The third groove 225 may be a groove in which the cartridge C is seated. The cartridge C may be fitted to the third groove 225. The cartridge C may be fixed to the tray 200 by the third groove 225. However, embodiments are not limited thereto, and for example, the cartridge C may not be placed in the third groove 225. The stub S or the grid holder GH may be placed in the third groove 225.

In FIG. 4, the stub S may include a plurality of stub grooves SH and the test wafer pieces W. The stub S may store the test wafer pieces W. The stub groove SH may fix the test wafer pieces W. The test wafer pieces W may be formed by the pre-processing module (140 of FIG. 1). The pre-processing module 140 may form the test wafer pieces W and fix the test wafer pieces W to the stub S. The test wafer pieces W may be seated in the stub groove SH of the stub S. The test wafer pieces W may be fitted and fixed to the stub grooves SH.

In embodiments, each stub groove SH may include a stub ID that includes information about the test wafer pieces W. The stub ID may be reported to the central module (195 of FIG. 1) by a computer. The central module 195 may track and control the stub ID. The central module 195 may track the history of the test wafer pieces W.

The grid holder GH may include a grid groove and a grid G. The grid G may be fitted and fixed to the grid groove. The grid G may store the test sample. The test sample may be formed in the sample fabrication module (150 of FIG. 1). The test sample may be formed by cutting the test wafer pieces W. The sample fabrication module 150 may form a test sample and fix it to the grid G. The grid G may be fitted and fixed to the grid groove.

In embodiments, the grid holder GH may include a grid ID including information about the test sample. The grid ID may be reported to central module 195 by a computer. The central module 195 may track and control the grid ID. The central module 195 may track the history of the test sample.

The cartridge C may be fitted to the third groove 225. The cartridge C may be an auxiliary container which prepares for additional expansion of the sample aid, for example, the test wafer pieces W or the test sample later.

The tray ID 230 may be placed on the side surface of the plate 210. For example, the tray ID 230 may be placed on a third side surface 210SS3 of the plate 210. In FIG. 4, the tray 200 may include a tray ID groove 230H. The tray ID groove 230H is placed on the side surface of the plate 210. The tray ID 230 may be fitted to the tray ID groove 230H and fixed to the plate 210.

The tray ID 230 may be generated in the tray stocker (170 of FIG. 1). The tray ID 230 stores the information about the tray 200. For example, the tray ID 230 may store information about the stub S and the grid holder GH. Further, the tray ID 230 may store information about the test wafer pieces W or the test sample. The tray ID 230 may be reported to the central module 195 by a computer. The central module 195 may track and control the tray ID 230. The central module 195 may track the history of the tray 200.

In FIGS. 5 to 8, the plate 210 includes a first side surface 210SS1, a second side surface 210SS2, a third side surface 210SS3, a fourth side surface 210SS4, and an upper surface 210US.

The first side surface 210SS1 and the second side surface 210SS2 are opposite to each other. The first side surface 210SS1 and the second side surface 210SS2 may extend in a second direction D2. The third side surface 210SS3 and the fourth side surface 210SS4 are opposite to each other. The third side surface 210SS3 and the fourth side surface 210SS4 may extend in a first direction D1. The third side surface 210SS3 and the fourth side surface 210SS4 may connect the first side surface 210SS1 and the second side surface 210SS2. The upper surface 210US may connect the first to fourth side surfaces 210SS1, 210SS2, 210SS3, and 210SS4.

The first direction D1, the second direction D2, and a third direction D3 may be substantially vertical to each other. Although the first side surface 210SS1 and the second side surface 210SS2 are shown as short sides extending in the second direction D2 of the plate 210, and the third side surface 210SS3 and the fourth side surface 210SS4 are shown as long sides extending in the first direction D1 of the plate 210, embodiments are not limited thereto.

In embodiments, the plate 210 may include an overhead hoist transport (OHT) handling region 240 and a tray stocker handling region 250.

The OHT handling region 240 may extend in the first direction D1 on the first side surface 210SS1 and the second side surface 210SS2. The OHT handling region 240 may include a portion extending in the first direction D1 from the first side surface 210SS1 toward the second side surface 210SS2, and a portion extending in the first direction D1 from the second side surface 210SS2 toward the first side surface 210SS1.

The OHT handling region 240 may be a region in which an OHT hand 185b of the tray transfer module grasps the tray 200. The OHT handling region 240 may not overlap the first groove 221, the second groove 223, and the third groove 225 in the second direction D2 and the third direction D3. However, embodiments are not limited thereto. At least a part of the OHT handling region 240 may overlap the first groove 221 or the third groove 225 in the third direction D3.

The OHT hand 185b includes a first portion 185b_1 and a second portion 185b_2. The first portion 185b_1 extends in the first direction D1. The second portion 185b_2 extends in the third direction D3. The first portion 185b_1 may be a portion to be inserted into the OHT handling region 240. The second portion 185b_2 may be connected to the OHT (185a of FIG. 13).

The OHT handling region 240 is a region into which the first portion 185b_1 of the OHT hand 185b is inserted. When the tray transfer module 185 loads and unloads the tray 200 into and from the first tray port (310 of FIG. 9) and the second tray port (410 of FIG. 10), the first portion 185b_1 of the OHT hand 185b is inserted into the OHT handling region 240 to grasp the tray 200. The OHT hand 185b may grasp the tray 200 using the OHT handling region 240 and convey the tray 200.

The tray stocker handling region 250 may extend from the third side surface 210SS3 to the fourth side surface 210SS4 in the second direction D2. The tray stocker handling region 250 may penetrate from the third side surface 210SS3 to the fourth side surface 210SS4. The tray stocker handling region 250 may be spaced apart from the OHT handling region 240 in the first direction D1.

The tray stocker handling region 250 may be a region into which the tray transfer robot 170b is inserted. At least a part of the tray stocker handling region 250 may overlap the first groove 221 and the third groove 225 in the third direction D3. The tray stocker handling region 250 may not overlap the tray ID 230 in the second direction D2. The tray stocker handling region 250 may include a portion that overlaps the first groove 221 in the third direction D3, and a portion that overlaps the third groove 225 in the third direction D3. The tray stocker handling region 250 does not overlap the second groove 223 in the third direction D3.

The tray transfer robot 170b includes a robot body 170b_1 and a robot arm 170b_2. The tray stocker handling region 250 is a region into which the robot arm 170b_2 is inserted.

When the tray 200 is loaded and unloaded into and from a tray drawer (170a of FIG. 18), the robot arm 170b_2 of the tray transfer robot 170b may be inserted into the tray stocker handling region 250 to grasp the tray 200. The tray transfer robot 170b may grasp the tray 200 and convey it to the tray drawer 170a.

In embodiments, the plurality of grooves 220 may include a sensor region 260. For example, the sensor region 260 includes a first sensor region 261, a second sensor region 263, and a third sensor region 265. The first sensor region 261 is placed inside the first groove 221. The second sensor region 263 is placed inside the second groove 223. The third sensor region 265 is placed inside the third groove 225.

The sensor region 260 may sense the loading of the stub S, the grid holder GH or the cartridge C. For example, the first sensor region 261 senses the loading of the stub S. The second sensor region 263 senses the loading of the grid holder GH. The third sensor region 265 senses the loading of the cartridge C.

For example, when the stub S is seated in the first groove 221, the first sensor region 261 may sense whether the stub S is seated in the first groove 221. This makes it possible to prevent other stubs S from being conveyed to the first groove 221 in advance. Similarly, when the grid holder GH is seated in the second groove 223, the second sensor region 263 may sense whether the grid holder GH is seated in the second groove 223. This makes it possible to prevent the other grid holder GH from being conveyed to the second groove 223 in advance. When the cartridge C is seated in the third groove 225, the third sensor region 265 may sense whether the cartridge C is seated in the third groove 225, and prevent the additional cartridge C from being conveyed to the third groove 225 in advance.

In embodiments, the plurality of grooves 220 may further include an EFEM handling region 270. The EFEM handling region 270 may be a region for the EFEM working robot (350 of FIG. 9) to grasp the stub S, the grid holder GH or the cartridge C.

The EFEM handling region 270 may include a first EFEM handling region 271, a second EFEM handling region 273, and a third EFEM handling region 275. The first EFEM handling region 271 is placed in the first groove 221. The second EFEM handling region 273 is placed in the second groove 223. The third EFEM handling region 275 is placed in the third groove 225. The first EFEM handling region 271 is a region for grasping the stub S. The second EFEM handling region 273 is a region for grasping the grid holder GH. The third EFEM handling region 275 is a region for grasping the cartridge C.

For example, in FIG. 8, the working robot 350 includes a hand 351 and a body portion 352. The hand 351 of the working robot 350 may be a portion that is inserted into the EFEM handling region 270. The hand 351 of the working robot 350 may be inserted into the first EFEM handling region 271 to grasp the stub S. The working robot 350 may convey the stub S, the grid holder GH, and the cartridge C. The hand 351 of the working robot 350 may be inserted into the second EFEM handling region 273 and the third EFEM handling region 275 to grasp the grid holder GH and the cartridge C, and convey them.

Figure 9:
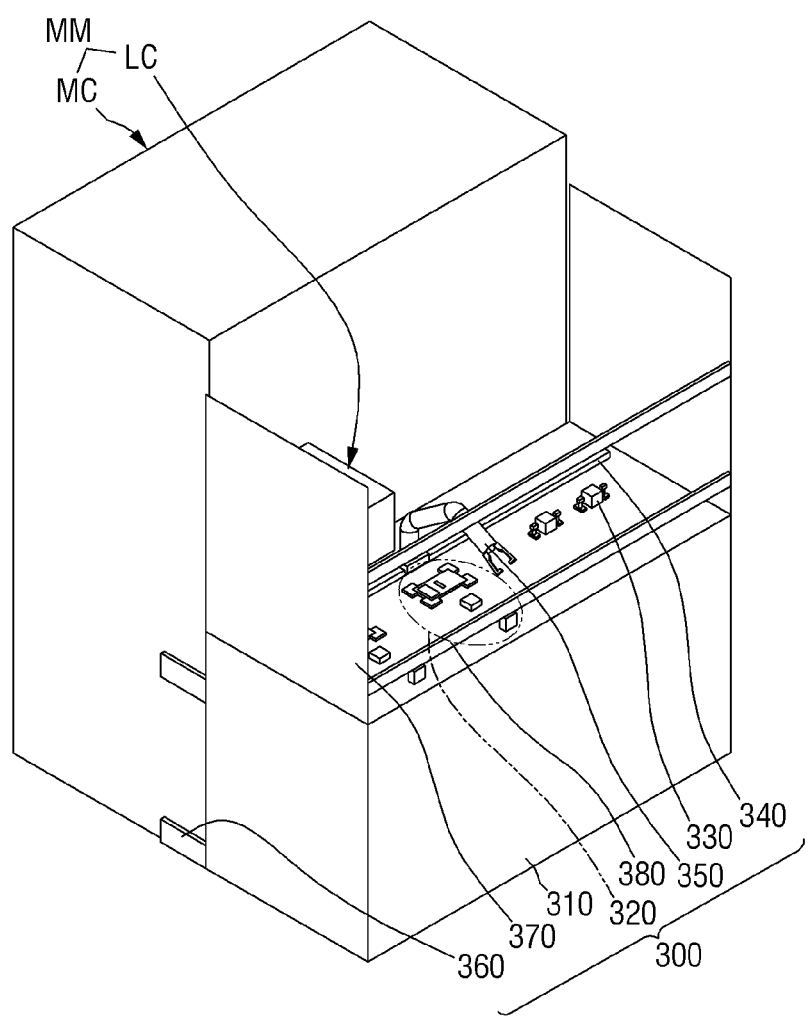
FIGS. 9 and 10 are perspective views illustrating a destructive analysis automation apparatus according to embodiments.
Figure 10:
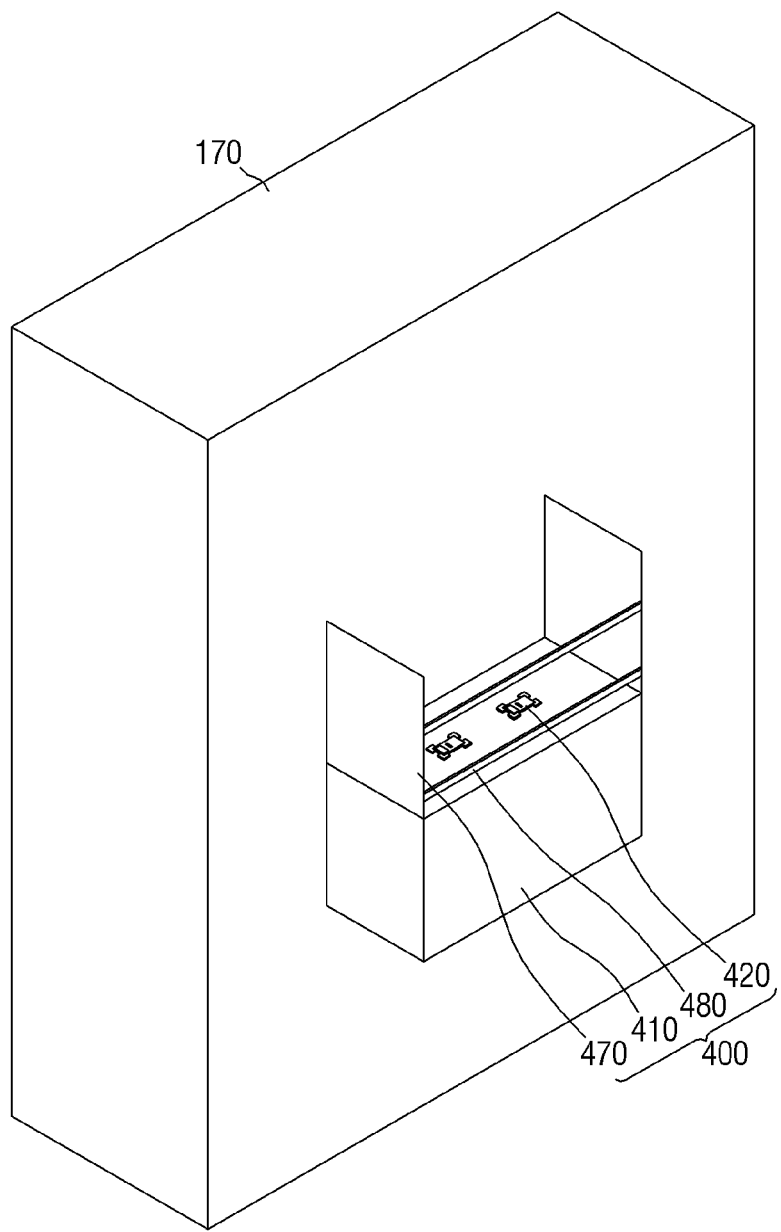

FIGS. 9 and 10 are perspective views illustrating a destructive analysis automation apparatus according to embodiments.

Referring to FIG. 9, the destructive analysis automation apparatus according to embodiments may include a main module MM and a first EFEM 300. The main module MM may be, for example, at least one of the pre-processing module 140, the sample fabrication module 150, and the analysis module 160 described in FIG. 1.

The first EFEM 300 may be coupled to the main module MM. The first EFEM 300 may be installed on one side of the main module MM. A fastening unit 360 of the first EFEM 300 may be coupled to the main module MM. The fastening unit 360 may couple and fix the first EFEM 300 and the main module MM.

The first EFEM 300 may include a first base module 310, a first tray port 320, a shuttle port 330, a robot transfer rail 340, a working robot 350, a fastening unit 360, a first screen fence 370 and a first protection bar 380.

The first base module 310 may have a rectangular parallelepiped shape. The first base module 310 may include a communication device that is able to communicate with the central module (195 of FIG. 1). The central module 195 may communicate with the first base module 310 to control the working robot 350. Further, the central module 195 may communicate with the first base module 310 to control the tray transfer module 185. The first tray port 320, the shuttle port 330, the working robot 350, and the like may be placed on one surface of the first base module 310.

The first tray port 320 may be placed on the first base module 310. The first tray port 320 may be a region into which the tray 200 is loaded. The tray transfer module 185 may load the tray 200 into the first tray port 320.

The shuttle port 330 may be placed on the first base module 310. The shuttle port 330 may be spaced apart from the first tray port 320. The shuttle port 330 may fix one stub S and one grid holder GH. The shuttle port 330 may be loaded into the main module MM. For example, the stub S and the grid holder GH inside the shuttle port 330 may be loaded into the main module MM.

The robot transfer rail 340 may extend in one direction on one surface of the first base module 310. The robot transfer rail 340 may extend in the direction along which the working robot 350 moves. The working robot 350 may move on the robot transfer rail 340 along the robot transfer rail 340.

The working robot 350 may be installed on the first base module 310. The working robot 350 may be installed on the robot transfer rail 340. The working robot 350 may be movable in one direction along the robot transfer rail 340. The working robot 350 may convey the stub S and the grid holder GH inside the tray 200. The working robot 350 may convey the shuttle port 330.

The fastening unit 360 may be installed on the side surface of the first base module 310. The fastening unit 360 may fix the main module MM and the first EFEM 300. Although four fastening units 360 are installed, the number of fastening units 360 is not limited thereto.

The first screen fence 370 may extend in the vertical direction along the side surfaces of the first base module 310. The first screen fence 370 may physically limit a drive region of the working robot 350 on the first base module 310. In addition, the first screen fence 370 may block the approach of the worker to prevent an occurrence of environmental safety accidents.

The first protection bar 380 may connect the first screen fence 370. The first protection bar 380 may extend in a horizontal direction. The first protection bar 380 may physically limit the drive region of the working robot 350 on the first base module 310, similar to the first screen fence 370. In addition, the first protection bar 380 may block the approach of worker to prevent an occurrence of environmental safety accidents.

The main module MM includes a main chamber MC and a load lock chamber LC. The load lock chamber LC may be a space into which the shuttle port 330 is loaded. The shuttle port 330 loaded into the load lock chamber LC may be loaded into the main chamber MC again. Various semiconductor destructive analysis works may be performed inside the main chamber MC.

As an example, when the main module MM is the pre-processing module 140, the pre-processing work is performed inside the main chamber MC of the main module MM. The pre-processing work is performed to form the test wafer pieces. As another example, when the main module MM is the sample fabrication module 150, the sample fabrication work is performed inside the main chamber MC. The sample fabrication work is performed to form a test sample. As still another example, when the main module MM is the analysis module 160, the photographing/analysis works are performed inside the main chamber MC.

When using the destructive analysis automation apparatus according to embodiments, the semiconductor destructive analysis work may be performed by an automation process. First, the sample aid necessary for the semiconductor destructive analysis work, for example, the test wafer piece or the test sample is loaded into the first EFEM 300. The sample aid is loaded into the load lock chamber LC and the main chamber MC by the automation process. The sample aid may be automatically unloaded from the main module MM after the semiconductor destructive analysis work has been performed in the main chamber MC. The sample aid includes an ID each including information about the sample aid. The ID is reported to the central module 195 by a computer. Therefore, the history of the semiconductor destructive analysis work may be tracked and controlled.

Referring to FIG. 10, the destructive analysis apparatus according to embodiments may include a tray stocker 170 and a second EFEM 400.

The second EFEM 400 may be installed on one side of the tray stocker 170. A lower surface of the second EFEM 400 may be spaced apart from a lower surface of the tray stocker 170. The second EFEM 400 may be spaced apart from a bottom surface of the analysis chamber (2000 of FIG. 1). However, embodiments are not limited thereto.

The second EFEM 400 includes a second base module 410, a second tray port 420, a second screen fence 470, and a second protection bar 480. Each of the second base module 410, the second tray port 420, the second screen fence 470, and the second protection bar 480 may be the same as the description of the first base module 310, the first tray port 320, the first screen fence 370, and the first protection bar 380 of FIG. 9.

Figure 11:
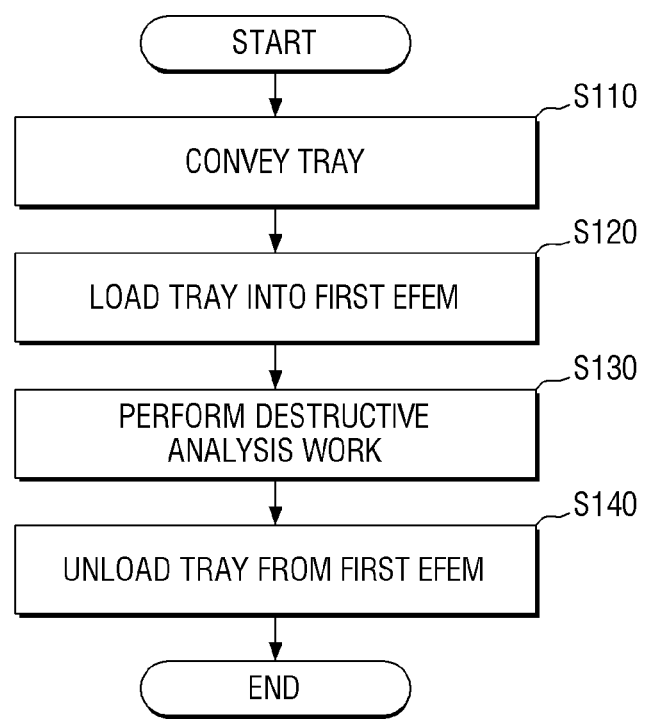
FIG. 11 is a flowchart illustrating the operating method of the destructive analysis automation apparatus according to embodiments.

FIG. 11 is a flowchart illustrating the operating method of the destructive analysis automation apparatus according to embodiments. As a reference, FIG. 11 may be a flowchart illustrating the operating method of conveying the tray 200 to the main module MM.

Referring to FIG. 11, the operating method of the destructive analysis automation apparatus according to embodiments may include a step of conveying the tray (S110) a step of loading the tray into the first EFEM (S120), a step of performing the destructive analysis work (S130), and a step of unloading the tray from the first EFEM (S140).

Figure 12:
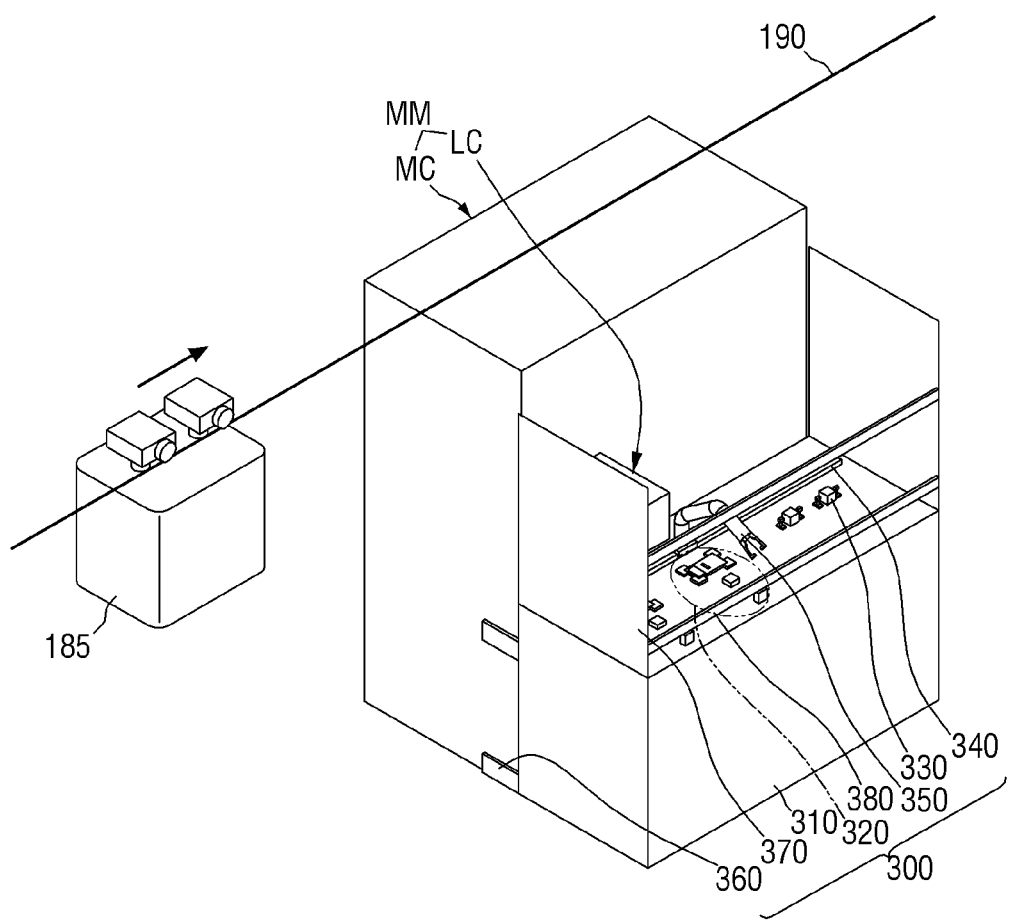
FIG. 12 is a diagram illustrating the step S110 of FIG. 11.

FIG. 12 is a diagram illustrating the step S110 of FIG. 11.

Referring to FIG. 12, the tray transfer module 185 may convey the tray 200 (S110). The tray transfer module 185 may move to a position adjacent to the main module MM and the first EFEM 300 along the transfer rail 190.

Figure 13:
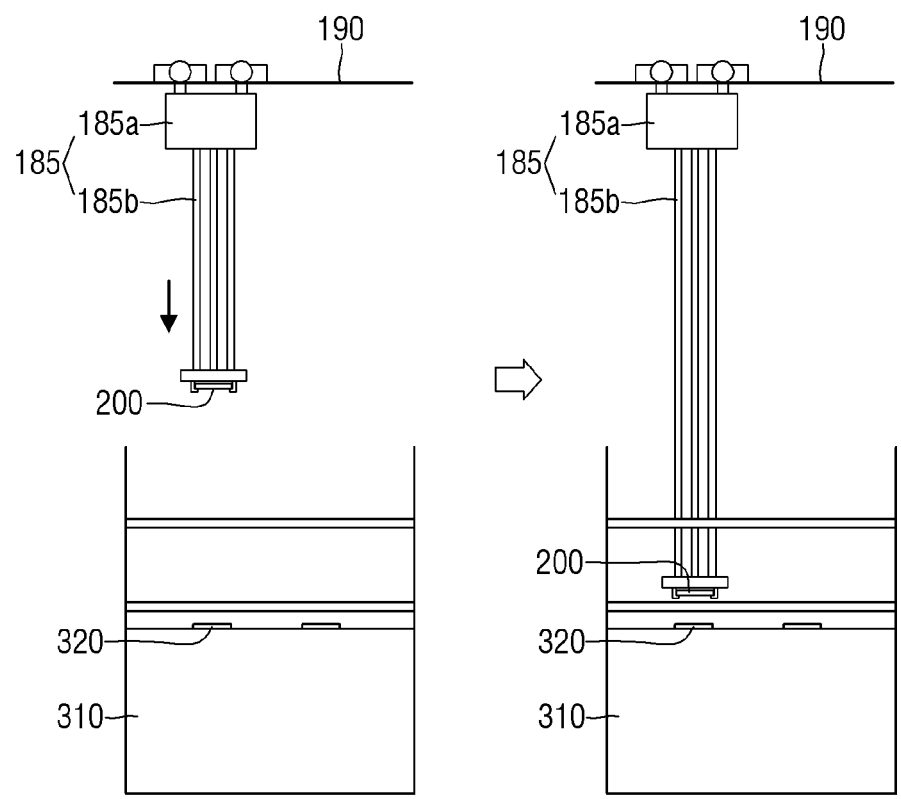
FIG. 13 is a diagram illustrating the step S120 of FIG. 11.

FIG. 13 is a diagram illustrating the step S120 of FIG. 11.

Referring to FIG. 13, the tray 200 may be loaded into the first EFEM 300 (S120).

The tray 200 may be loaded into the first tray port 320. The tray transfer module 185 may move along the transfer rail 190 and located on the first EFEM 300. The tray transfer module 185 may include an OHT 185a and an OHT hand 185b. The OHT 185a may be a space in which a plurality of trays 200 are stored. The OHT 185a may be connected to the transfer rail 190. The OHT 185a may move along the transfer rail 190. The OHT hand 185b may be placed inside the OHT 185a. The OHT hand 185b may extend in the vertical direction.

For example, the OHT 185a may be installed on the ceiling of the analysis chamber 2000, and the first EFEM 300 may be installed on the bottom surface of the analysis chamber 2000. In order to load the tray 200 stored in the OHT 185a into the first EFEM 300, it is necessary to lower the tray 200 in the vertical direction. At this time, the OHT hand 185b may grasp the tray 200 and descend in the vertical direction. Therefore, the OHT hand 185b may load the tray 200 into the first tray port 320 of the first EFEM 300. At this time, the OHT hand 185b may be inserted into the OHT handling region 240 of the tray 200 to grasp the tray 200.

When the tray 200 is already loaded into the first tray port 320 of the first EFEM 300, the first tray port 320 may communicate with the tray transfer module 185 to control the tray transfer module 185 so that the tray 200 is not loaded into the first tray 200.

The working robot 350 may then convey the stub S and the grid holder GH on the tray 200 to the shuttle port 330 of the first EFEM 300. After that, the working robot 350 may load the shuttle port 330 into the main module MM.

When the working robot 350 grasps the stub S, the hand 351 of the working robot 350 is inserted into the first EFEM handling region (271 of FIG. 8) to grasp the stub S. When the working robot 350 grasps the grid holder GH, the hand 351 of the working robot 350 is inserted into the second EFEM handling region (273 of FIG. 8) to grasp the grid holder GH. When the working robot 350 grasps the cartridge C, the hand 351 of the working robot 350 is inserted into the third EFEM handling region (275 of FIG. 8) to grasp the cartridge C.

The main module MM may perform the destructive analysis work (S130). As an example, when the main module MM is the pre-processing module 140, the main module MM performs the pre-processing work. As another example, when the main module MM is the sample fabrication module 150, the main module MM performs the sample fabrication operation. As still another example, when the main module MM is the analysis module 160, the main module MM performs photographing/analysis works.

After that, the shuttle port 330 is unloaded from the main module MM. The working robot 350 conveys the shuttle port 330 from the main module MM to the first base module 310. Next, the working robot 350 conveys the stub S and the grid holder GH fixed to the shuttle port 330 to the tray 200 fixed to the first tray port 320.

Figure 14:
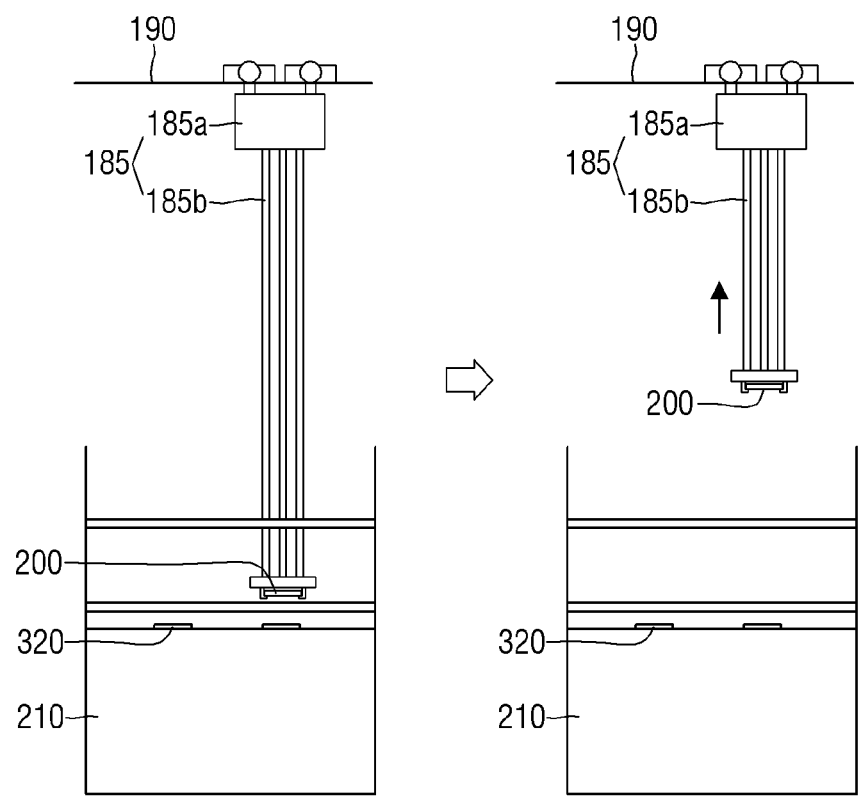
FIG. 14 is a diagram illustrating the step S140 of FIG. 11.

FIG. 14 is a diagram illustrating the step S140 of FIG. 11.

Referring to FIG. 14, the tray 200 may be unloaded from the first EFEM 300 (S140).

The tray 200 may be unloaded from the first tray port 320. The OHT hand 185b of the tray transfer module 185 may descend in the vertical direction. The OHT hand 185b may grasp the tray 200. For example, the OHT hand 185b may be inserted into the OHT handling region 240 of the tray 200 to grasp the tray 200. Subsequently, the OHT hand 185b may ascend in the vertical direction. The tray 200 may be stored in the OHT 185a again.

Figure 15:
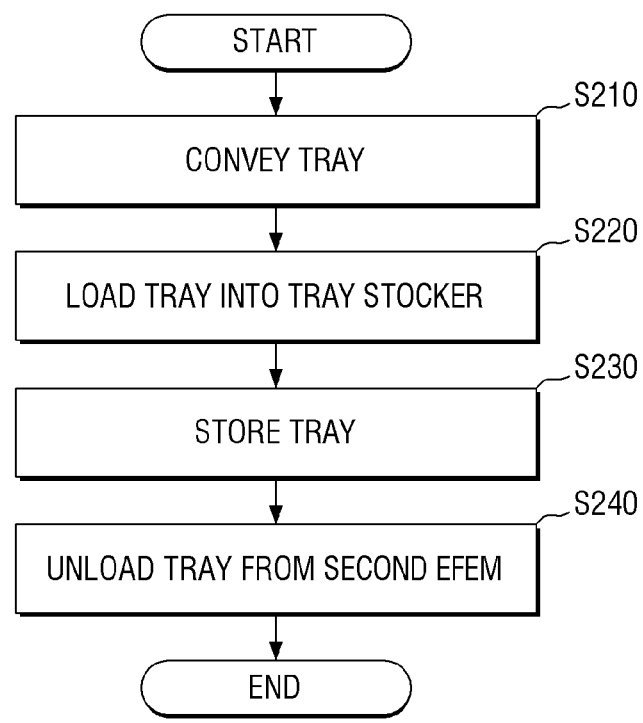
FIG. 15 is a flowchart illustrating the operating method of the destructive analysis automation apparatus according to embodiments.

FIG. 15 is a flowchart illustrating the operating method of the destructive analysis automation apparatus according to embodiments. For example, FIG. 15 may be a flowchart illustrating the operating method of conveying the tray 200 to the tray stocker 170.

Referring to FIG. 15, the operating method of the destructive analysis automation apparatus according to embodiments may include a step of conveying the tray (S210), a step of loading the tray into the tray stocker (S220), a step of storing the tray (S230), and a step of unloading the tray from the second EFEM (S240).

Figure 16:
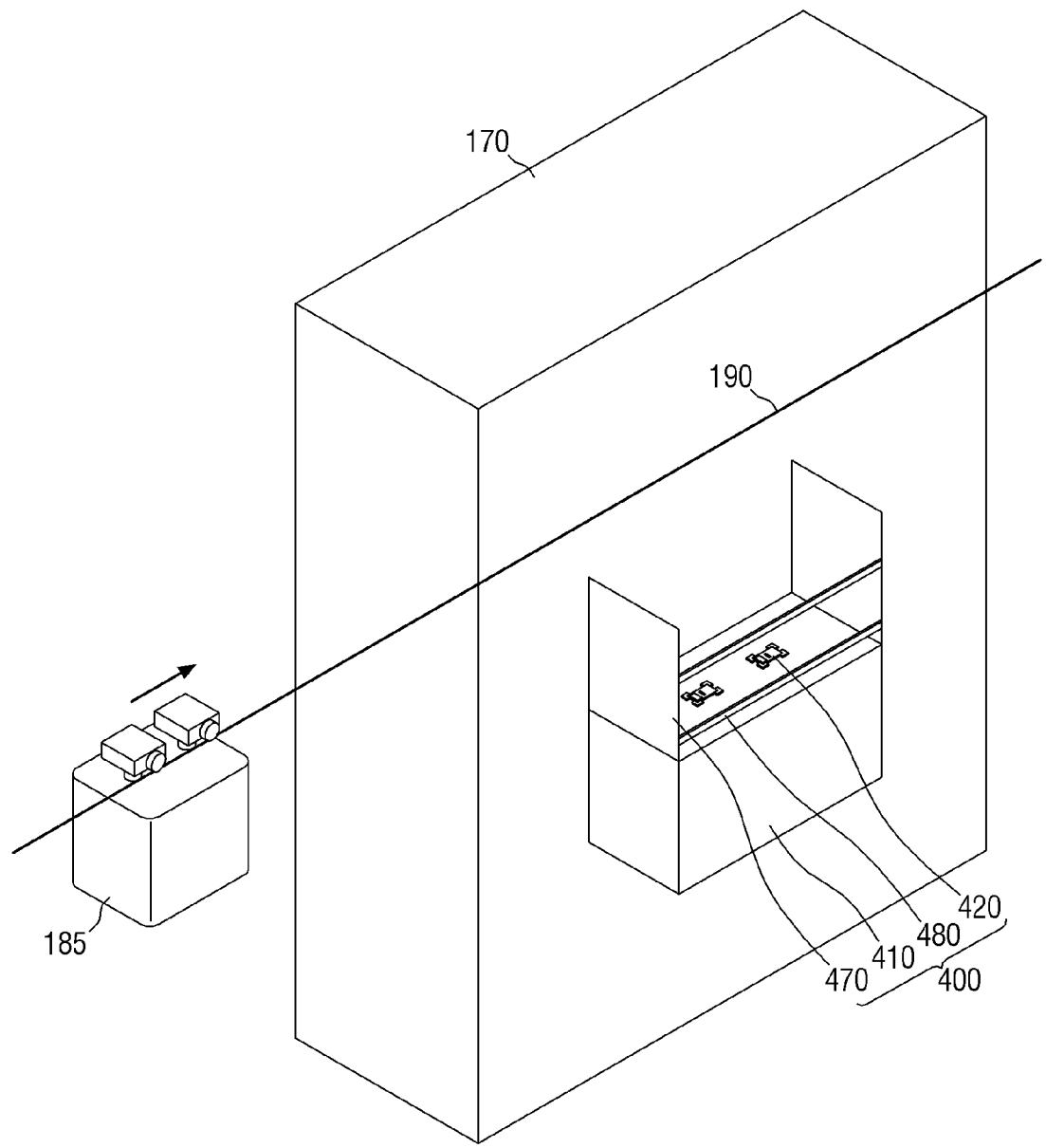
FIG. 16 is a diagram illustrating step S210 of FIG. 15.

FIG. 16 is a diagram illustrating step S210 of FIG. 15.

Referring to FIG. 16, the tray transfer module 185 may convey the tray 200 (S210). The tray 200 unloaded from the first EFEM 300 may be placed in the tray transfer module 185 and conveyed along the transfer rail 190. The tray transfer module 185 may move to a position adjacent to the tray stocker 170 and the second EFEM 400.

Figure 17:
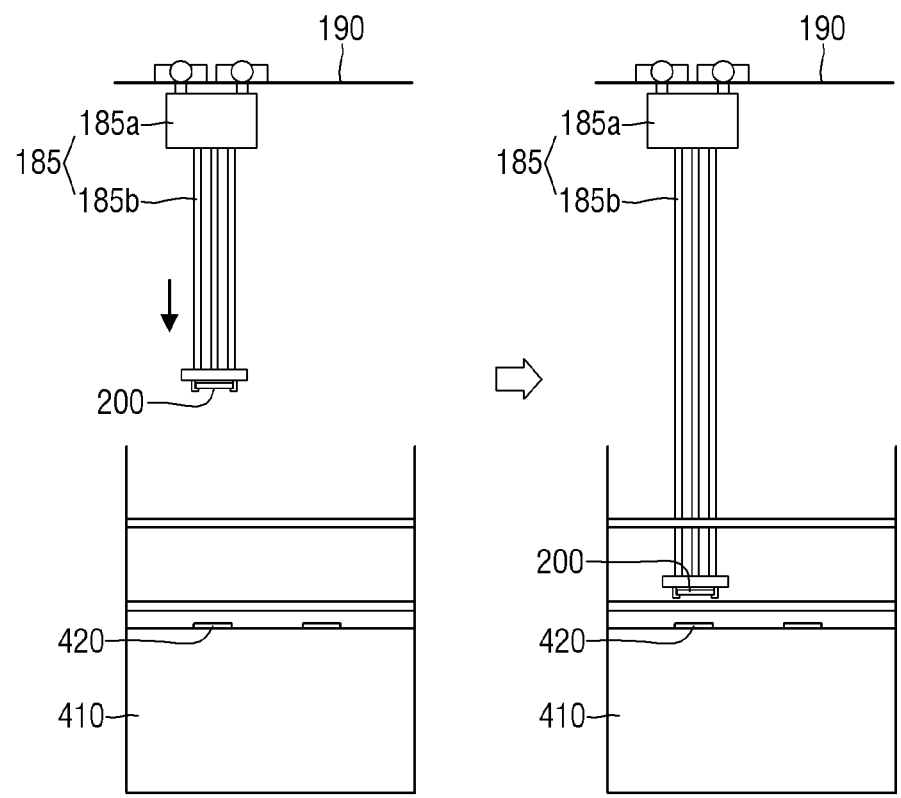
FIG. 17 is a diagram illustrating the step S220 of FIG. 15.

FIG. 17 is a diagram illustrating the step S220 of FIG. 15.

Referring to FIG. 17, the tray 200 may be loaded into the tray stocker 170 (S220). First, the tray transfer module 185 may move along the transfer rail 190 and be located on the second EFEM 400. The tray 200 may then be loaded into the second EFEM 400. The tray 200 may be loaded into the second tray port 420.

The OHT hand 185b may grasp the tray 200 and descend in the vertical direction. For example, the OHT hand 185b may be inserted into the OHT handling region 240 of the tray 200 to grasp the tray 200. Subsequently, the OHT hand 185b may descend in the vertical direction. The OHT hand 185b may load the tray 200 into the second tray port 420 of the second EFEM 400.

When the tray 200 is already loaded into the second tray port 420 of the second EFEM 400, the second tray port 420 may communicate with the tray transfer module 185 to control the tray transfer module 185 so that the tray 200 is not loaded into the second tray port 420.

Next, the tray 200 loaded into the second tray port 420 may be loaded into the tray stocker 170. The destructive analysis apparatus according to embodiments may further include a connecting rail that connects the second EFEM 400 and the tray stocker 170. The tray 200 may be loaded into the tray stocker 170 along the connecting rail.

Figure 18:
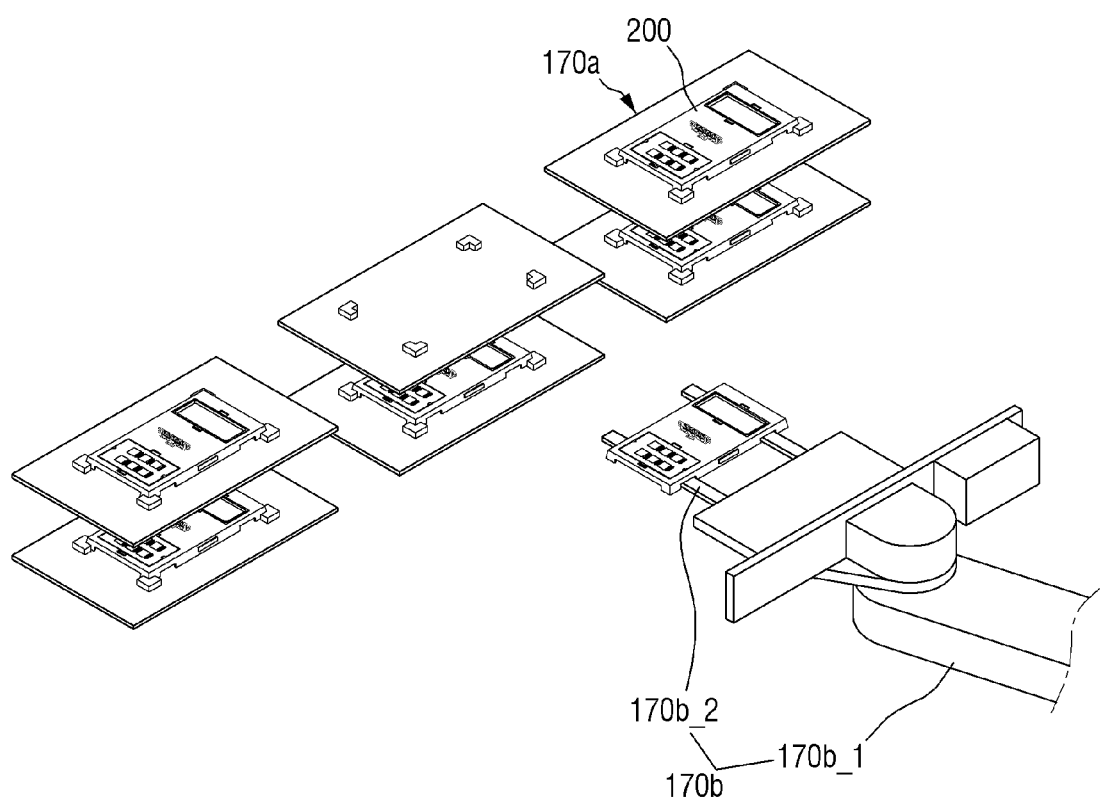
FIGS. 18, 19, and 20 are diagrams illustrating the step S230 of FIG. 17.
Figure 19:
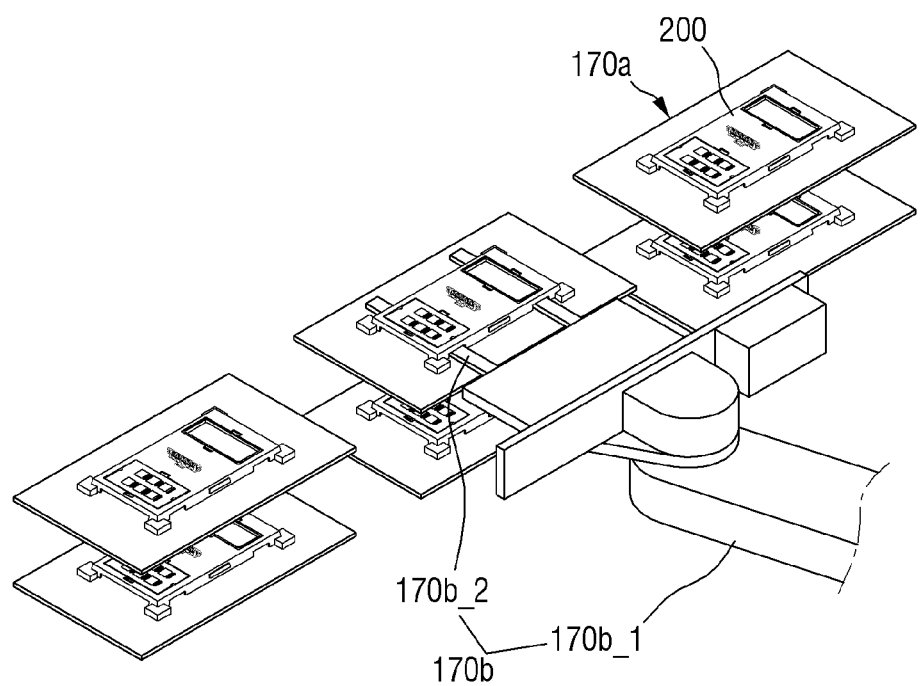
Figure 20:
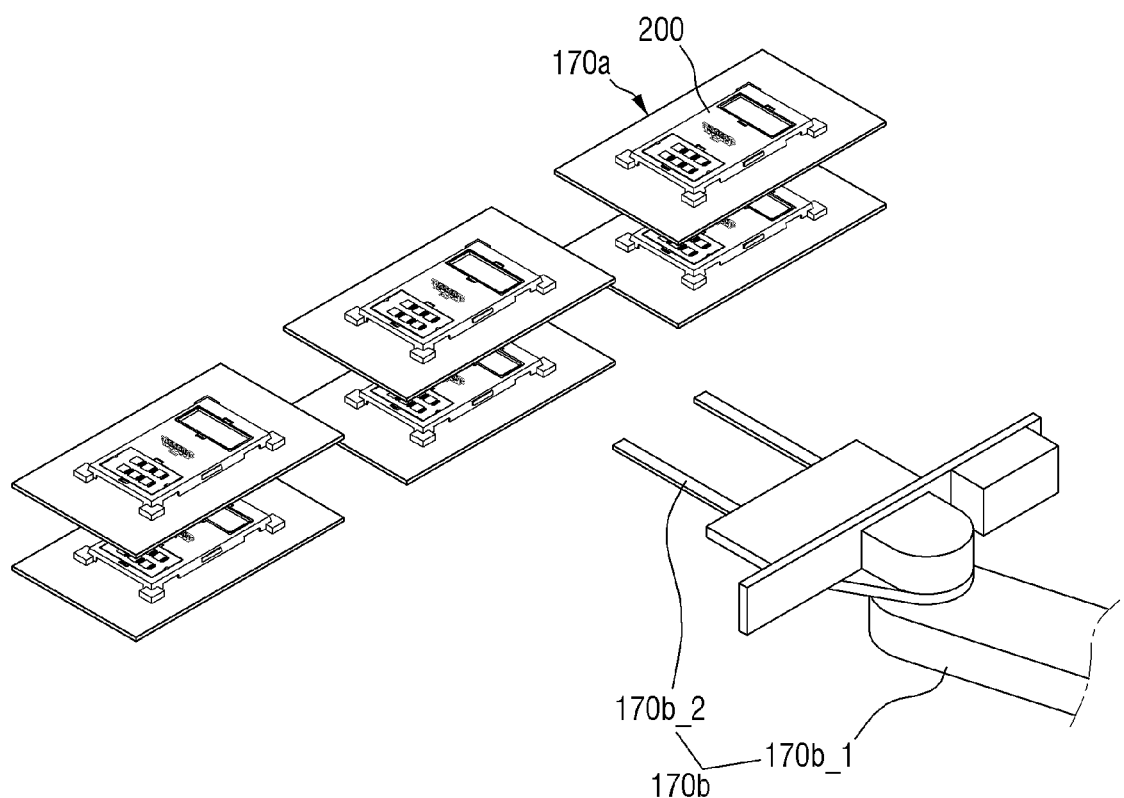

FIGS. 18 to 20 are diagrams illustrating the step S230 of FIG. 17.

Referring to FIGS. 18 to 20, the tray 200 may be stored in the tray stocker 170 (S230).

The tray stocker 170 may include a tray drawer 170a and a tray transfer robot 170b. At least one tray drawer 170a may be provided. The tray drawer 170a may be a space in which the tray 200 is stored. The tray transfer robot 170b is a robot for conveying the tray 200 inside the tray stocker 170.

For example, the tray transfer robot 170b may grasp the tray 200 loaded into the connecting rail. After that, the tray transfer robot 170b may convey the tray 200 to the tray drawer 170a. Further, the tray transfer robot 170b may convey the tray 200 from the tray drawer 170a to the connecting rail.

The tray transfer robot 170b includes a robot body 170b_1 and a robot arm 170b_2. The robot arm 170b_1 may be connected to the robot body 170b_1. The robot arm 170b_2 may grasp the tray 200. For example, the robot arm 170b_2 may be inserted into the tray stocker handling region 250 of the tray 200. The robot arm 170b_2 may be inserted into the tray stocker handling region 250 to grasp the tray 200.

In FIG. 18, the tray transfer robot 170b may grasp the tray 200. The robot arm 170b_2 of the tray transfer robot 170b may be inserted into the tray stocker handling region 250. The tray transfer robot 170b may convey the tray 200. The tray transfer robot 170b moves to the tray drawer 170a, while grasping the tray 200.

In FIG. 19, the tray transfer robot 170b may place the tray 200 on the tray drawer 170a. In FIG. 20, the tray transfer robot 170b may move to grasp another tray 200. For reference, FIGS. 18 to 20 may be a procedure of storing the tray 200 in the tray drawer 170a.

When the procedures of FIGS. 18 to 20 are in the reverse order, the procedure may be a procedure of carrying out the tray 200 from the tray drawer 170a to the connecting rail. For example, the tray transfer robot 170b grasps the tray 200 placed in the tray drawer 170a. At this time, the robot arm 170b_2 of the tray transfer robot 170b may be inserted into the tray stocker handling region 250. Subsequently, the tray transfer robot 170b may move to the connecting rail, while grasping the tray 200. The tray transfer robot 170b may convey the tray 200 to the connecting rail and unload the tray 200 from the tray stocker 170.

Figure 21:
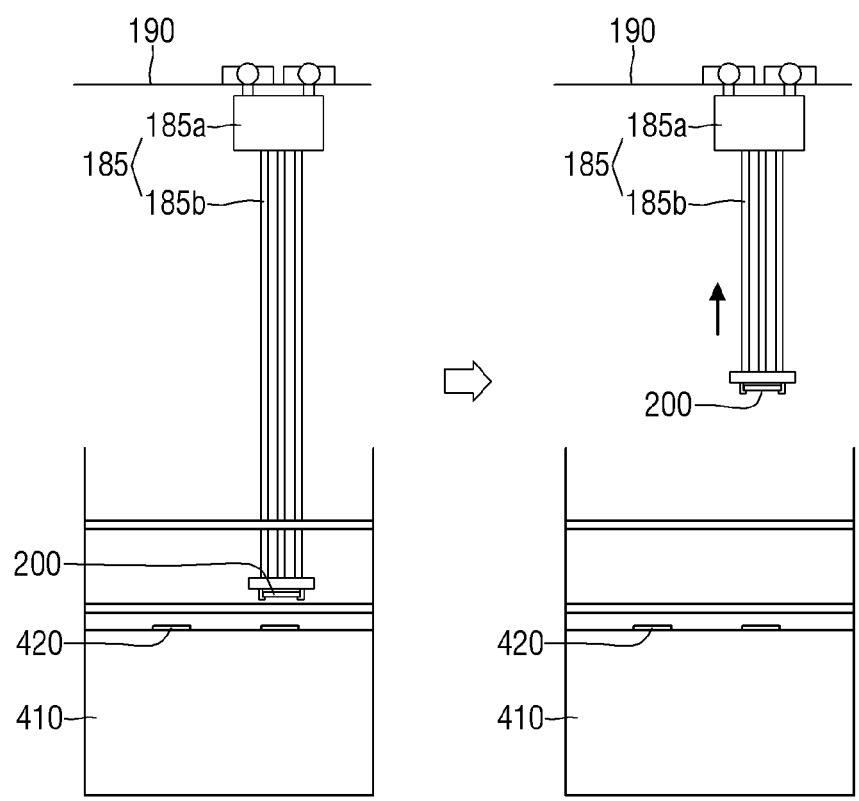
FIG. 21 is a diagram illustrating the step S240 of FIG. 17.

FIG. 21 is a diagram illustrating the step S240 of FIG. 17.

Referring to FIG. 21, the tray 200 may be unloaded from the second EFEM 400 S240. The tray 200 may be unloaded from the second tray port 420. The OHT hand 185b of the tray transfer module 185 may descend in the vertical direction. The OHT hand 185b may grasp the tray 200. For example, the OHT hand 185b may be inserted into the OHT handling region 240 of the tray 200 to grasp the tray 200. Subsequently, the OHT hand 185b may ascend in the vertical direction. The tray 200 may be stored in the OHT 185a again.

While example embodiments have been described with reference to the figures, it will be understood by those of ordinary skill in the art that various changes in form and details may be made therein without departing from the spirit and scope as defined by the following claims and their equivalents.

What is claimed is:

1. A tray comprising:
a plate comprising a first region and a second region;
a first groove, on the first region of the plate, to which a stub is fixed; and
a second groove, on the second region of the plate, to which a grid holder is fixed,
wherein the stub is configured to store test wafer pieces, and
wherein the grid holder is configured to store a test sample that is formed by cutting the test wafer pieces.

2. The tray of claim 1, wherein the plate comprises a third region that is different from the first region and the second region, and
wherein the tray further comprises a third groove on the third region of the plate.

3. The tray of claim 2, wherein the third groove is configured to fix at least one of a cartridge and the stub.

4. The tray of claim 1, wherein the stub comprises at least one or more stub grooves, and
wherein the test wafer pieces are fixed to the at least one or more stub grooves.

5. The tray of claim 4, wherein the at least one or more stub grooves respectively comprises a stub ID comprising information about the test wafer pieces,
wherein the stub ID is reported to a processor by a computer, and
wherein the processor is configured to track and control the stub ID.

6. The tray of claim 1, wherein the grid holder comprises a grid ID comprising information about the test sample,
   wherein the grid ID is reported to a processor by a computer, and
   wherein the processor is configured to track and control the grid ID.

7. The tray of claim 1, wherein the grid holder comprises at least one or more grids, and
   wherein the test sample is fixed to the at least one or more grids.

8. The tray of claim 1, further comprising:
   a tray ID on a side surface of the plate and comprising information about the stub and information about the grid holder,
   wherein the tray ID is reported to a processor by a computer, and
   wherein the processor is configured to track and control the tray ID.

9. The tray of claim 1, wherein the first groove comprises a first sensor region, and
   wherein the first sensor region is configured to sense loading of the stub.

10. The tray of claim 9, wherein the second groove comprises a second sensor region, and
    wherein the second sensor region is configured to detect loading of the grid holder.

11. A tray comprising:
    a plate comprising a first side surface, a second side surface opposite to the first side surface, a third side surface that connects the first side surface and the second side surface, a fourth side surface opposite to the third side surface, and an upper surface that connects the first side surface, the second side surface, the third side surface, and the fourth side surface;
    a plurality of grooves, on the upper surface of the plate, respectively configured to fix a stub and a grid holder; and
    a tray ID on the third side surface,
    wherein the stub is configured to store test wafer pieces,
    wherein the grid holder is configured to store a test sample, and
    wherein the plate comprises an overhead hoist transport (OHT) handling region extending from the first side surface and the second side surface in a first direction, and a tray stocker handling region extending from the third side surface to the fourth side surface in a second direction.

12. The tray of claim 11, wherein at least a part of the tray stocker handling region overlaps a groove to which the stub is fixed in a third direction.

13. The tray of claim 11, wherein the OHT handling region overlaps the tray stocker handling region in the second direction and a third direction.

14. The tray of claim 11, wherein the plurality of grooves respectively comprises a sensor region, and the sensor region is configured to sense loading of the stub or the grid holder.

15. The tray of claim 11, wherein the tray stocker handling region does not overlap the tray ID in the second direction.

16. The tray of claim 11, wherein the tray ID is reported to a processor by a computer, and
    wherein the processor is configured to track and control the tray ID.

17. The tray of claim 11, wherein the stub comprises at least one or more stub grooves, and
    wherein the test wafer pieces are fixed to the at least one or more stub grooves.

18. The tray of claim 11, wherein the grid holder comprises at least one or more grids, and
    wherein the test sample is fixed to the at least one or more grids.

19. A destructive analysis automation apparatus comprising:
    a tray stocker configured to store a tray and generate a tray ID including information about the tray;
    a main device configured to form test wafer pieces and form a test sample;
    a first equipment front end module (EFEM) installed on a side of the main device; and
    a second EFEM installed on a side of the tray stocker,
    wherein the tray comprises:
      a plate comprising a first region and a second region,
      a first groove, on the first region of the plate, to which a stub is fixed, and
      a second groove on the second region of the plate and to which a grid holder is fixed,
    wherein the tray ID is on a side surface of the plate,
    wherein the stub is configured to store the test wafer pieces, and
    wherein the grid holder is configured to store the test sample.

20. The destructive analysis automation apparatus of claim 19, further comprising:
    a tray transfer device configured to load the tray into the first EFEM or the second EFEM.

* * * * *